(12) United States Patent
Heikman et al.

(10) Patent No.: US 9,105,824 B2
(45) Date of Patent: Aug. 11, 2015

(54) HIGH REFLECTIVE BOARD OR SUBSTRATE FOR LEDS

(75) Inventors: Sten Heikman, Goleta, CA (US); Zhimin Jamie Yao, Goleta, CA (US); James Ibbetson, Santa Barbara, CA (US); Fan Zhang, Goleta, CA (US)

(73) Assignee: Cree, Inc., Durham, NC (US)

( * ) Notice: Subject to any disclaimer, the term of this patent is extended or adjusted under 35 U.S.C. 154(b) by 423 days.

(21) Appl. No.: 13/370,696

(22) Filed: Feb. 10, 2012

(65) Prior Publication Data

US 2012/0199843 A1   Aug. 9, 2012

Related U.S. Application Data

(63) Continuation-in-part of application No. 13/017,778, filed on Jan. 31, 2011, now Pat. No. 8,803,201, which is a continuation-in-part of application No. 12/757,179, filed on Apr. 9, 2010.

(51) Int. Cl.
*H01L 33/46* (2010.01)
*H01L 33/60* (2010.01)
(Continued)

(52) U.S. Cl.
CPC ............... *H01L 33/60* (2013.01); *H01L 33/54* (2013.01); *H01L 33/62* (2013.01); *H01L 2224/73265* (2013.01)

(58) Field of Classification Search
CPC ..... H01L 25/0753; H01L 33/60; H01L 33/46; H01L 33/507
USPC .......................................................... 257/98
See application file for complete search history.

(56) References Cited

U.S. PATENT DOCUMENTS

| | | | |
|---|---|---|---|
| 1,393,573 A | 10/1921 | Ritter | ............................. 362/509 |
| 1,880,399 A | 10/1932 | Benjamin | |

(Continued)

FOREIGN PATENT DOCUMENTS

| | | |
|---|---|---|
| CN | 1841183 A | 10/2006 |
| CN | 1957481 | 5/2007 |

(Continued)

OTHER PUBLICATIONS

First Office Action from Japanese Patent Appl. No. 201180047069.4, dated: Dec. 18, 2013 Search Report from Japanese Patent Appl. No. 201180047069.4, dated: Dec. 18, 2013.

(Continued)

*Primary Examiner* — Evan Pert
(74) *Attorney, Agent, or Firm* — Koppel, Patrick, Heybl & Philpott

(57) ABSTRACT

Light emitting devices and methods are disclosed that provide improved light output. The devices have an LED mounted to a substrate, board or submount characterized by improved reflectivity, which reduces the absorption of LED light. This increases the amount of light that can emit from the LED device. The LED devices also exhibit improved emission characteristics by having a reflective coating on the submount that is substantially non-yellowing. One embodiment of a light emitting device according to the present invention comprises a submount having a circuit layer. A reflective coating is included between at least some of the elements of the circuit layer. A light emitting diode mounted to the circuit layer, the reflective coating being reflective to the light emitted by the light emitting diode. In some embodiments, the reflective coating comprises a carrier with scattering particles having a different index of refraction than said carrier material.

42 Claims, 6 Drawing Sheets

(51) Int. Cl.
*H01L 33/54* (2010.01)
*H01L 33/62* (2010.01)

(56) References Cited

U.S. PATENT DOCUMENTS

| | | | |
|---|---|---|---|
| 2,214,600 A | 9/1940 | Winkler | 362/279 |
| 2,981,827 A | 4/1961 | Orsatta | 362/84 |
| 2,981,927 A | 4/1961 | McKenney | |
| 3,395,272 A | 7/1968 | Nicholl | 362/305 |
| 4,420,800 A | 12/1983 | Van Horn | 362/297 |
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 5,768,339 A | 6/1998 | O'Hara | 378/147 |
| 5,912,915 A | 6/1999 | Reed et al. | 372/93 |
| 6,055,261 A | 4/2000 | Reed et al. | |
| 6,076,948 A | 6/2000 | Bukosky et al. | 362/494 |
| 6,111,276 A * | 8/2000 | Mauk | 257/98 |
| 6,149,283 A | 11/2000 | Conway et al. | |
| 6,409,361 B1 | 6/2002 | Ikeda | 362/240 |
| 6,454,439 B1 | 9/2002 | Camarota | |
| 6,459,713 B2 | 10/2002 | Jewell | 372/46 |
| 6,558,032 B2 | 5/2003 | Kondo et al. | 362/516 |
| 6,585,397 B1 | 7/2003 | Ebiko | |
| 6,603,151 B2 * | 8/2003 | Lin et al. | 257/98 |
| 6,657,236 B1 | 12/2003 | Thibeault et al. | 257/98 |
| 6,720,583 B2 | 4/2004 | Nunoue et al. | 257/98 |
| 6,758,582 B1 | 7/2004 | Hsiao et al. | |
| 6,784,462 B2 | 8/2004 | Schubert | |
| 6,793,373 B2 | 9/2004 | Matsuba et al. | 362/260 |
| 6,797,987 B2 | 9/2004 | Chen | 257/98 |
| 6,812,502 B1 | 11/2004 | Chien et al. | 257/99 |
| 6,817,737 B2 | 11/2004 | Romano et al. | 362/293 |
| 6,840,652 B1 | 1/2005 | Hymer | 362/235 |
| 6,986,594 B2 | 1/2006 | Wirth et al. | |
| 6,995,402 B2 * | 2/2006 | Ludowise et al. | 257/91 |
| 7,055,991 B2 | 6/2006 | Lin | 362/311.02 |
| 7,121,690 B1 | 10/2006 | Ramer et al. | |
| 7,213,940 B1 | 5/2007 | Van de Ven et al. | 362/231 |
| 7,221,044 B2 * | 5/2007 | Fan et al. | 257/676 |
| 7,275,841 B2 | 10/2007 | Kelly | 362/345 |
| 7,321,126 B2 | 1/2008 | Singer et al. | 250/492 |
| 7,332,365 B2 | 2/2008 | Nakamura et al. | |
| 7,339,965 B2 | 3/2008 | Ledenstov et al. | 372/45 |
| 7,573,074 B2 | 8/2009 | Shum et al. | 257/99 |
| 7,622,746 B1 | 11/2009 | Lester et al. | 257/98 |
| 7,638,810 B2 | 12/2009 | Bour et al. | 257/98 |
| 7,722,220 B2 | 5/2010 | Van De Ven | 362/294 |
| 7,784,977 B2 | 8/2010 | Moolman et al. | 362/298 |
| 7,795,623 B2 | 9/2010 | Emerson et al. | 257/79 |
| 7,821,023 B2 | 10/2010 | Yuan et al. | 257/98 |
| 7,915,629 B2 | 3/2011 | Ibbetson et al. | 257/98 |
| 7,922,366 B2 | 4/2011 | Li | 362/304 |
| 8,118,451 B2 | 2/2012 | Householder et al. | 362/277 |
| 8,212,273 B2 | 7/2012 | McKenzie et al. | |
| 8,235,541 B2 * | 8/2012 | Chen | 362/97.3 |
| 8,324,652 B1 | 12/2012 | Lester et al. | |
| 8,431,423 B2 | 4/2013 | Basin et al. | 438/26 |
| 8,492,785 B2 * | 7/2013 | Hodota | 257/98 |
| 8,791,471 B2 * | 7/2014 | Leung | 257/88 |
| 2003/0025212 A1 | 2/2003 | Bhat et al. | |
| 2003/0128733 A1 | 7/2003 | Tan et al. | 372/96 |
| 2003/0210550 A1 | 11/2003 | Matsuba et al. | |
| 2004/0155565 A1 | 8/2004 | Holder et al. | 313/113 |
| 2004/0217362 A1 | 11/2004 | Slater et al. | |
| 2005/0063061 A1 | 3/2005 | Grawert et al. | 359/586 |
| 2005/0168994 A1 | 8/2005 | Jacobson et al. | 362/311 |
| 2005/0211993 A1 | 9/2005 | Sano et al. | 257/79 |
| 2005/0225222 A1 * | 10/2005 | Mazzochette et al. | 313/46 |
| 2005/0242358 A1 | 11/2005 | Tu et al. | |
| 2006/0039009 A1 | 2/2006 | Kiesel et al. | 356/519 |
| 2006/0049411 A1 | 3/2006 | Nakamura et al. | |
| 2006/0060874 A1 | 3/2006 | Edmond et al. | 257/98 |
| 2006/0076568 A1 | 4/2006 | Keller et al. | 257/98 |
| 2006/0157723 A1 | 7/2006 | Lampkin et al. | 257/98 |
| 2006/0163586 A1 | 7/2006 | Denbaars et al. | |
| 2006/0163589 A1 * | 7/2006 | Fan et al. | 257/88 |
| 2006/0278885 A1 | 12/2006 | Tain et al. | |
| 2007/0057270 A1 | 3/2007 | Bour et al. | 257/99 |
| 2007/0139923 A1 | 6/2007 | Negley | |
| 2007/0145380 A1 | 6/2007 | Shum et al. | |
| 2007/0158668 A1 | 7/2007 | Tarsa et al. | 257/79 |
| 2007/0217193 A1 | 9/2007 | Lin | |
| 2007/0217200 A1 * | 9/2007 | Yang et al. | 362/277 |
| 2008/0035949 A1 | 2/2008 | Fudeta et al. | 257/99 |
| 2008/0061304 A1 | 3/2008 | Huang et al. | |
| 2008/0123341 A1 | 5/2008 | Chiu et al. | |
| 2008/0144688 A1 | 6/2008 | Chua et al. | |
| 2008/0173884 A1 | 7/2008 | Chitnis et al. | 438/22 |
| 2008/0179611 A1 | 7/2008 | Chitnis et al. | 257/98 |
| 2008/0185609 A1 | 8/2008 | Kozawa et al. | 257/99 |
| 2008/0191233 A1 | 8/2008 | Yang et al. | |
| 2008/0265268 A1 | 10/2008 | Braune et al. | 257/98 |
| 2008/0272391 A1 | 11/2008 | Kapur et al. | |
| 2008/0310158 A1 | 12/2008 | Harbers et al. | 362/294 |
| 2009/0026478 A1 | 1/2009 | Yoon et al. | 257/98 |
| 2009/0029495 A1 * | 1/2009 | Li et al. | 438/29 |
| 2009/0050908 A1 | 2/2009 | Yuan et al. | 257/88 |
| 2009/0121241 A1 | 5/2009 | Keller et al. | 257/94 |
| 2009/0152583 A1 | 6/2009 | Chen et al. | 257/98 |
| 2009/0213591 A1 * | 8/2009 | Katabe et al. | 362/236 |
| 2009/0231856 A1 | 9/2009 | Householder | |
| 2009/0283779 A1 | 11/2009 | Negley et al. | 257/88 |
| 2009/0283787 A1 | 11/2009 | Donofrio et al. | 257/98 |
| 2010/0001299 A1 | 1/2010 | Chang et al. | 257/89 |
| 2010/0012962 A1 | 1/2010 | Hong et al. | |
| 2010/0029023 A1 * | 2/2010 | Neff et al. | 438/15 |
| 2010/0038659 A1 | 2/2010 | Chen et al. | |
| 2010/0039822 A1 | 2/2010 | Bailey | 362/296 |
| 2010/0051995 A1 | 3/2010 | Katsuno et al. | |
| 2010/0059785 A1 | 3/2010 | Bo Lin et al. | |
| 2010/0065881 A1 | 3/2010 | Kim | |
| 2010/0103678 A1 | 4/2010 | Van de Ven et al. | 362/294 |
| 2010/0117099 A1 * | 5/2010 | Leung | 257/88 |
| 2010/0117111 A1 * | 5/2010 | Illek et al. | 257/98 |
| 2010/0140635 A1 | 6/2010 | Ibbetson et al. | |
| 2010/0140636 A1 | 6/2010 | Donofrio et al. | 257/98 |
| 2010/0155746 A1 | 6/2010 | Ibbetson et al. | |
| 2010/0158437 A1 | 6/2010 | Decorby | 385/14 |
| 2010/0165633 A1 | 7/2010 | Moolman et al. | |
| 2010/0171094 A1 | 7/2010 | Lu et al. | 257/13 |
| 2010/0252840 A1 | 10/2010 | Ibbetson et al. | |
| 2010/0279437 A1 * | 11/2010 | Neff et al. | 438/14 |
| 2010/0308354 A1 * | 12/2010 | David et al. | 257/98 |
| 2010/0327295 A1 * | 12/2010 | Peng et al. | 257/88 |
| 2011/0001148 A1 * | 1/2011 | Sun et al. | 257/88 |
| 2011/0001422 A1 * | 1/2011 | Aanegola et al. | 313/501 |
| 2011/0025190 A1 * | 2/2011 | Jagt | 313/499 |
| 2011/0044027 A1 * | 2/2011 | Chen | 362/97.1 |
| 2011/0049546 A1 | 3/2011 | Heikman et al. | 257/98 |
| 2011/0075423 A1 | 3/2011 | Van De Ven | |
| 2011/0182073 A1 * | 7/2011 | Sanpei et al. | 362/294 |
| 2012/0086026 A1 | 4/2012 | Engl et al. | |

FOREIGN PATENT DOCUMENTS

| | | |
|---|---|---|
| CN | 201007449 | 1/2008 |
| CN | 101449100 | 6/2009 |
| CN | 101460779 | 6/2009 |
| DE | 102004040277 | 2/2006 |
| DE | 102007003282 | 7/2008 |
| DE | 102008005497 | 7/2009 |
| DE | 102008035900 | 11/2009 |
| EP | 1750310 A2 | 7/2007 |
| EP | 2259345 A1 | 8/2010 |
| EP | 2369650 A2 | 9/2011 |
| JP | 06045649 | 2/1994 |
| JP | 06268252 | 9/1994 |
| JP | 2005197289 | 7/2005 |
| TW | 595689 | 5/2003 |
| TW | 595689 | 6/2004 |
| TW | M281297 | 11/2005 |
| TW | 200805717 | 1/2008 |
| TW | 200834991 | 8/2008 |

(56) References Cited

FOREIGN PATENT DOCUMENTS

| WO | WO 00/34709 A1 | 6/2000 |
|---|---|---|
| WO | WO 2011031098 A2 | 3/2001 |
| WO | WO 2005/066539 A1 | 7/2005 |
| WO | 2005078338 | 8/2005 |
| WO | WO 2005/078338 A1 | 8/2005 |
| WO | WO 2005117152 | 12/2005 |
| WO | WO 2006/092697 A1 | 9/2006 |
| WO | WO 2007121739 | 1/2007 |
| WO | WO 2007115040 | 10/2007 |
| WO | WO 2007/130536 A2 | 11/2007 |
| WO | WO 2008089324 A2 | 7/2008 |
| WO | WO 2008089324 A3 | 7/2008 |
| WO | WO 2008107654 | 9/2008 |
| WO | WO 2008149250 | 12/2008 |
| WO | WO 2009/056927 A1 | 5/2009 |
| WO | WO 2010/029475 A1 | 3/2010 |
| WO | WO 2010029475 | 3/2010 |
| WO | WO 2010151600 | 12/2010 |
| WO | WO 2011071100 A1 | 6/2011 |

OTHER PUBLICATIONS

Comments on the Written Opinion and Amendment of the Application from European Patent Appl. No. 12723543.0, dated Feb. 21, 2014.
Final Office Action from U.S. Appl. No. 12/553,025, dated Dec. 31, 2013.
Lin, et al., "Enhancement of InGaN-GaN Indium—Tin—Oxide Flip-Chip Light-Emitting Diodes with TiO2-SiO2 Multilayer Stack Omnidirectional Reflector", IEEE Photonics Technology Letters, vol. 18, No. 19. Oct. 1, 2006.
International Search Report and Written Opinion for PCT Application No. PCT/US2011/001394 mailed Nov. 3, 2011.
Second OA from Chinese Patent Appl. No. 201080023107.8, dated Mar. 7, 2014.
Office Action from U.S. Appl. No. 12/757,179, dated Mar. 11, 2014.
Office Action from U.S. Appl. No. 13/909,927, dated Apr. 2, 2014.
Office Action from U.S. Appl. No. 12/606,377, dated Apr. 9, 2014.
International Preliminary Report on Patentability from Application No. PCT/US09/66938, dated Apr. 3, 2012.
"High-Performance GaN-Based Vertical-Injection Light-Emitting Diodes With TiO2-SiO2 Omnidirectional Reflector and n-GaN Roughness" by H. W. Huang, et al., IEEE Photonics Technology Letters, vol. 19. No. 8. Apr. 15, 2007, pp. 565-567.
International Search Report and Written Opinion from PCT Application No. PCT/US2013/028684, dated May 28, 2013.
Jong Kyu kim, et al., "GaInN Light-emitting Diodes with RuO2/SiO2/Ag Omni-directional Reflector", Applied Physics Letters. AIP, American Institute of Physics, Nelville. NY, US, vol. 84. No. 22, May 31, 2004, pp. 4508-4510, XP012061652.
Y.S. Zhao, et al., "Efficiency Enhancement of InGaN/GaN Light-Emitting Diodes with a Back-Surface distributed Bragg Reflector", Journal of Electronic Materials, vol. 32, No. 12, Dec. 1, 2003, pp. 1523-1526, XP055063308.
Xu Qing-tao, et al., "Enhancing Extraction Efficiency from GaN-based LED by Using an Omni-directional Reflector and Photonic Crystal", Optoelectronics Letters, vol. 5, No. 6. Nov. 1, 2009, pp. 405-408, XP055063309.
J.-Q Xi, et al., "Optical Thin-film Materials with Low Refractive Index for Broadband Elimination of Fresnel Reflection", Nature Photonics. Nature Publishing Group, UK. vol. 1, No. 3, Mar. 1. 2007, pp. 176-179, XP002590687.
First Office Action from Chinese Patent Application No. 2009-801492034, dated Jun. 24, 2014.
Notice of Reasons for Rejection from Japanese Patent Appl. No. 2011-539526, dated Jun. 25, 2013.
First Office Action and Search Report from Chinese Patent Appl. No. 201080023107.8, dated Jul. 12, 2013.
International Search Report and Written Opinion for Application No. PCT/US2012/034564, dated Sep. 5, 2012.
Office Action from U.S. Appl. No. 12/855,500, dated May 31, 2013.
Response to OA from U.S. Appl. No. 12/855,500, filed Sep. 3, 2013.
Office Action from U.S. Appl. No. 13/071,345, dated May 28, 2013.
Response to OA from U.S. Appl. No. 13/071,349, filed Jul. 18, 2013.
Office Action from U.S. Appl. No. 13/071,349, dated Jan. 17, 2013.
Response to OA from U.S. Appl. No. 13/071,349, filed Apr. 12, 2013.
Office Action from U.S. Appl. No. 12/553,025, dated Jun. 19, 2013.
Huang et al. High-Performance GaN-Based Vertical-Injection Light-Emitting Diodes with TiO2-Sio2 Ohnidirectional Reflector and n-Gan Roughness. IEEE Photonics Technology Letters, vol. 19, No. 8, Apr. 15, 2007, pp. 565-567.
Raoufi et al. Surface characterization and microstructure of ITO thin films at different annealing temperatures. Applied Surface Science 253 (2007), pp. 9085-9090.
Office Action from U.S. Appl. No. 13/168,689, dated Jun. 28, 2013.
Office Action from U.S. Appl. No. 12/606,377, dated Jul. 9, 2013.
Office Action from U.S. Appl. No. 12/418,796, dated Aug. 7, 2012.
Response to OA from U.S. Appl. No. 12/418,796, filed Nov. 7, 2012.
Office Action from U.S. Appl. No. 12/418,796, dated Feb. 22, 2012.
Response to OA from U.S. Appl. No. 12/418,796, filed Jun. 22, 2012.
Office Action from U.S. Appl. No. 13/415,626, dated Sep. 28, 2012.
Response to OA from U.S. Appl. No. 13/415,626, filed Jan. 23, 2013.
Office Action from U.S. Appl. No. 12/855,500, dated Oct. 1, 2012.
Response to OA from U.S. Appl. No. 12/855,500, filed Feb. 25, 2013.
Office Action from U.S. Appl. No. 12/606,377, dated Nov. 26, 2012.
Response to OA from U.S. Appl. No. 12/606,377, filed Feb. 22, 2013.
Office Action from U.S. Appl. No. 12/757,179, dated Dec. 31, 2012.
Response to OA from U.S. Appl. No. 12/757,179, filed Apr. 23, 2013.
Office Action from U.S. Appl. No. 13/415,626, dated Feb. 28, 2013.
Response to OA from U.S. Appl. No. 13/415,626, filed Apr. 17, 2013.
Decision of Patent Grant from Japanese Patent Appl. No. 2011-539526, dated Oct. 22, 2013.
CREE EZ400 LED Data Sheet, 2007 Cree's EZBright LEDs.
CREE EZ700 LED Data Sheet, 2007 Cree's EZBright LEDs.
CREE EZ1000 LED Data Sheet, 2007 Cree's EZBright LEDs.
CREE EZBright290 LED Data Sheet, 2007 Cree's EZBright LEDs.
International Search Report and Written Opinion for counterpart Application No. PCT/US2009/066938 mailed Aug. 30, 2010.
High-Performance GaN-Based Vertical-Injection Light-Emitting Diodes with TiO2-SiO2 Omnidirectional Reflector and n-GaN Roughness, H.W. Huang, IEEE Photonics Technology Letters vol. 19 No. 8, Apr. 15, 2007.
C.H. Lin et al., Enhancement of InGaN-GaN Indium—Tin—Oxide Flip-Chip Light-Emitting Diodes with TiO2-SiO2 Multilayer Stack Omnidirectional Reflector, IEEE Photonics Technology Letters, vol. 18, No. 19, Oct. 1, 2006, pp. 2050-2052.
Windisch et al. Impact of Texture-Enhanced Transmission on High-Efficiency Surface-Textured Light-Emitting Diodes, Applied Physics Letters, vol. 79, No. 15, Oct. 2001, pp. 2315-2317.
Schnitzer et al. "30% External Quantum Efficiency From Surface Textured, Thin-Film Light-Emitting Diodes," Applied Physics Letters, Oct. 18, 1993, vol. 64, No. 16, pp. 2174-2176.
Windisch et al. "Light-Extraction Mechanisms in High-Efficiency Surface-Textured Light-Emitting Diodes," IEEE Journal on Selected Topics in Quantum Electronics, vol. 8, No. 2, Mar./Apr. 2002, pp. 248-255.
Streubel, et al. High Brightness AlGaInP Light-Emitting Diodes, IEEE Journal on Selected Topics in Quantum Electronics, vol. 8, No. 2, Mar./Apr. 2002, pp. 321-332.
Office Action from U.S. Appl. No. 12/418,796, Dated: Jul. 20, 2011.
Office Action from U.S. Appl. No. 12/329,722, Dated: Oct. 27, 2010.
International Search Report and Written Opinion for PCT Application No. PCT/US2010/002827 mailed May 2, 2011 (1).
International Search Report and Written Opinion for PCT/US2011/001394 mailed Nov. 3, 2011.
Office Action from U.S. Appl. No. 12/855,500, dated Dec. 4, 2013.
First Office Action from Chinese Patent Appl. No. 201180047069.4, dated Dec. 18, 2013.
DOM LED Downlighting, Lithonia Lighting: an Acuity Brands, Company, www.lithonia.com, © 2009.
Ecos. Lighting the Next Generation. gothan: a division of Acuity Brands Lighting Inc., © 2008.
Renaissance Lighting brochure, © 2010.

(56) References Cited

OTHER PUBLICATIONS

First Office Action and Search Report from Chinese Patent Appl. No. 2009-801492053, dated Jun. 20, 2014.
Office Action from U.S. Appl. No. 12/757,179, dated Jul. 15, 2014.
Office Action from U.S. Appl. No. 13/909,927, dated Aug. 8, 2014.
European Examination Report from European Patent Appl. No. 10 725 524.2-1757, dated Nov. 3, 2014.
Search Report from Taiwanese Appl. No. 099121883, dated Oct. 2, 2014.
Huang, et al., "High-Performance GaN-Based Vertical-Injection Light-Emitting Diodes With TiO2-SiO2 Omnidriectional Reflector and n-GaN Roughness", IEEE Photonics Technology Letters, vol. 19, No. 8, Apr. 15, 2007.
International Search Report and Written Opinion from PCT/US2014/058896, dated Dec. 22, 2014.
Office Action from U.S. Appl. No. 13/028,946, dated Oct. 28, 2014.
Response to OA from U.S. Appl. No. 13/028,946, filed Dec. 15, 2014.
Office Action from U.S. Appl. No. 14/219,916, dated Oct. 29, 2014.
Office Action from U.S. Appl. No. 13/909,927, dated Nov. 6, 2014.
Third Office Action from Chinese Appl. No. 201080023107.8, dated Sep. 29, 2014.
Communication from European Appl. No. 13709035.3-1551, dated Oct. 15, 2014.
Office Action from U.S. Appl. No. 12/606,377, dated Sep. 3, 2014.
Response to OA from U.S. Appl. No. 12/606,377, filed Oct. 23, 2014.
Examination Report from European Patent Appl. No. 10774320.5-1757, dated Sep. 5, 2014.
Second Office Action from Chinese Patent Appl. No. 2011800470694, dated Aug. 6, 2014.
International Preliminary Report on Patentability from Appl. No. PCT/US2013/028684, dated Sep. 18, 2014.
Second Office Action from Chinese Patent Appl. No. 2009801492034, dated Jan. 6, 2015.
Examiner's Report from European Patent Appl. No. 10 774 320.5-1757, dated Feb. 10, 2015.
Second Office Action from Chinese Patent Appl. No. 2009801492034, dated Jan. 6. 2015.
Office Action and Search Report from Taiwanese Patent Appl. No. 10420278720, dated Mar. 9. 2015.
Office Action from U.S. Appl. No. 12/553,025, dated Jan. 13, 2015.
Sanchez et al. Ion and electron beam assisted growth of nanometric SimOn structures for near field microscopy. Review of Scientific Instruments, vol. 73. #11, 2002, pp. 3901-3907.
Office Action from U.S. Appl. No. 14/185,585, dated Feb. 19, 2015.
Office Action from U.S. Appl. No. 12/606,377, dated Mar. 2, 2015.
Office Action from U.S. Appl. No. 14/219.916, dated Mar. 6, 2015.
Su, et al., "Nitride-Based LED's with n-GaN Current Spreading Layers", 2005, IEEE Electron Devices Letters, vol. 26, No. 12. pp. 891-893; Dec. 2005.
Office Action from Chinese Patent Appl. No. 200980149205.3, dated Mar. 11, 2015.
Rejection Decision Chinese Patent Appl. No. 201080023107,8, dated Mar. 19, 2015.
Office Action from Taiwanese Patent Appl. No. 099110005, dated Mar. 26, 2015.
Office Action from Taiwanese Patent Appl. No. 099110005, dated Mar. 23. 2015.
Third Office Action from Chinese Appl. No. 2011800470694, dated Apr. 29, 2015.
Office Action from U.S. Appl. No. 13/909,927, dated Apr. 23, 2015.
Office Action from U.S. Appl. No. 12/553,025, dated May 29, 2015.

\* cited by examiner

US 9,105,824 B2

HIGH REFLECTIVE BOARD OR SUBSTRATE FOR LEDS

This application is a continuation-in-part from, and claims the benefit of U.S. patent application Ser. No. 13/017,778, to Andrews, filed on Jan. 31, 2011, and entitled "Solid State Lighting Component Package With Reflective Layer, and U.S. patent application Ser. No. 12/757,179 to Yuan et al., filed Apr. 9, 2010 and entitled "High Reflective Substrate of Light Emitting Devices With Improved Light Output."

BACKGROUND OF THE INVENTION

1. Field of the Invention

The present invention relates generally to light emitting devices, packages or lamps, and more particularly to these devices having highly reflective properties for improved light output.

2. Description of the Related Art

Light emitting diodes (LED or LEDs) are solid state devices that convert electric energy to light and generally comprise an active region of semiconductor material sandwiched between two oppositely doped layers of semiconductor material. When a bias is applied across the doped layers, holes and electrons are injected into the active region where they recombine to generate light. Light is emitted from the active layer and from all surfaces of the LED.

LEDs can be fabricated to emit light in various colors. However, conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (Ce:YAG). The surrounding phosphor material "downconverts" the energy of some of the LED's blue light which increases the wavelength of the light, changing its color to yellow. Some of the blue light passes through the phosphor without being changed while a portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

LEDs have certain characteristics that make them desirable for many lighting applications that were previously the realm of incandescent or fluorescent lights. Incandescent lights are very energy-inefficient light sources with approximately ninety percent of the electricity they consume being released as heat rather than light. Fluorescent light bulbs are more energy efficient than incandescent light bulbs by a factor of about 10, but are still relatively inefficient. LEDs by contrast, can emit the same luminous flux as incandescent and fluorescent lights using a fraction of the energy.

In addition, LEDs can have a significantly longer operational lifetime. Incandescent light bulbs have relatively short lifetimes, with some having a lifetime in the range of about 750-1000 hours. Fluorescent bulbs can also have lifetimes longer than incandescent bulbs such as in the range of approximately 10,000-20,000 hours, but provide less desirable color reproduction. In comparison, LEDs can have lifetimes between 50,000 and 70,000 hours. The increased efficiency and extended lifetime of LEDs is attractive to many lighting suppliers and has resulted in their LED lights being used in place of conventional lighting in many different applications. It is predicted that further improvements will result in their general acceptance in more and more lighting applications. An increase in the adoption of LEDs in place of incandescent or fluorescent lighting would result in increased lighting efficiency and significant energy saving.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package/component 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflector cup due to the less than 100% reflectivity of practical reflector surfaces). In addition, heat retention may be an issue for a package such as the package 10 shown in FIG. 1, since it may be difficult to extract heat through the leads 15A, 15B.

LED component 20 illustrated in FIG. 2 may be more suited for high power operations which may generate more heat. In LED component 20, one or more LED chips 22 are mounted onto a carrier such as a printed circuit board (PCB) carrier, substrate or submount 23. A metal reflector 24 is mounted on the submount 23, surrounds the LED chip(s) 22, and reflects light emitted by the LED chips 22 away from the package 20. The reflector 24 also provides mechanical protection to the LED chips 22. One or more wire bond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Other LED components or lamps have been developed that comprise an array of multiple LED packages mounted to a (PCB), substrate or submount. The array of LED packages can comprise groups of LED packages emitting different colors, and specular reflector systems to reflect light emitted by the LED chips. Some of these LED components are arranged to produce a white light combination of the light emitted by the different LED chips.

Techniques for generating white light from a plurality of discrete light sources have been developed that utilize different hues from different discrete light sources, such as those described in U.S. Pat. No. 7,213,940, entitled "Lighting Device and Lighting Method". These techniques mix the light from the discrete sources to provide white light. In some applications, mixing of light occurs in the far field such that when viewed directly the different hued sources of light can be separately identified, but in the far field the light combines to produce light which is perceived as white. One difficulty with mixing in the far field is that the individual discrete sources can be perceived when the lamp or luminaire is viewed directly. Accordingly, the use of only far field mixing may be most appropriate for these lighting applications where the light sources are mechanically obscured from a user's view. However, mechanically obscuring the light sources may result in lower efficiency as light is typically lost by the mechanical shielding.

In recent years, there have been dramatic improvements in light emitting diode technology such that LEDs of increased brightness and color fidelity have been introduced. Due to these improved LEDs, lighting modules have become available to further increase luminous flux output. Both single and multi-chip modules have become available, with a single-chip module generally comprising a single package with a single LED. Multi-chip lighting modules typically comprise a single package with a plurality of LEDs. These lighting modules, particularly the multi-chip modules, generally allow for high output of light emission.

However, the emitted light from the device chip(s) may be largely non-directional and non-uniform, which can negatively impact the emission and optical efficiency of a lighting module. Often, a light diffusion lens, light scattering particles, and/or phosphor particles are disposed over the chip(s) to assist in achieving more uniform light emission. A fraction of brightness can be lost when utilizing such means, largely due to back-emission from the emitter, or scattering and back-reflection of light from a light diffusion lens, light scattering particles, and phosphor particles. This back emitted light can be directed toward substrate portions that are not very reflective, such as portions covered by solder mask materials. This can result in a percentage of this light being absorbed, thereby reducing overall emission efficiency.

To redirect the back-emitted, scattered and/or back-reflected light, reflective materials have been disposed on the substrate of various light emitting devices. The reflective materials may be disposed on only portions of the substrate, or may be disposed as a reflective layer on the substrate. In other attempts to redirect scattered and/or back-reflected light, light-reflective, white printed circuit board (PCB) and/or substrate technology has been developed. The materials used for this existing technology are generally epoxy-based. Epoxy contains free radicals that may yellow during prolonged use and/or common fabrication steps known in the art, such as reflow soldering. Epoxy materials may also degrade in the presence of blue light.

SUMMARY OF THE INVENTION

The present invention provides light emitting devices and methods directed to improved light output. The different embodiments according to the present invention are arranged to provide improved reflectivity of the substrates, boards or submounts, thereby reducing the absorption of LED light. This in turn increases the amount of light that can emit from the LED device. The LED devices also exhibit improved emission characteristics of the device over its lifetime by having a reflective coating on the submount that is substantially non-yellowing.

One embodiment of a light emitting device according to the present invention comprises a submount having a circuit layer. A reflective coating is included between at least some of the elements of the circuit layer. A light emitting diode is mounted to the circuit layer, and the reflective coating is reflective to the light emitted by the light emitting diode.

Another embodiment of a light emitting device according to the present invention also comprises a submount having a circuit layer, and a reflective coating between at least some of the elements of the circuit layer. A light emitting diode is flip-chip mounted to the circuit layer, with the LED spanning the space between at least two of the circuit layer elements. The top surface of the reflective coating that is below the LED is lower than the surface of the circuit layer or at the same level.

Still another embodiment of a light emitting device according to the present invention comprises a submount having a circuit layer, with the top surface of the circuit layer having a smaller surface area than the bottom surface of the circuit layer. A reflective coating is included between at least some of the elements of the circuit layer and a light emitting diode is mounted to the circuit layer.

One method for fabricating an LED device according to the present invention comprises providing a submount or substrate with a circuit layer. A reflective coating is then applied to the submount over the circuit layer, and in spaces between the circuit layer elements. A portion of the reflective coating is then removed to the top surface of the circuit layer.

These and other further features and advantages of the invention would be apparent to those skilled in the art from the following detailed description, taken together with the accompanying drawings, in which:

DETAILED DESCRIPTION OF THE INVENTION

Figure 1:
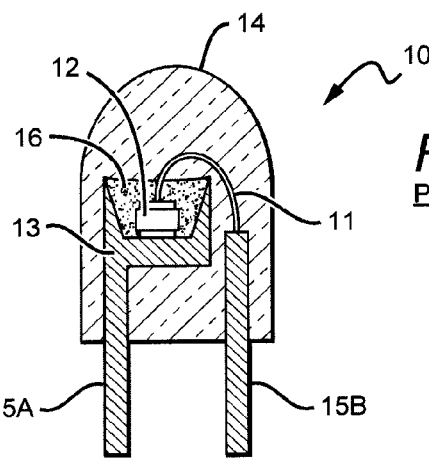
FIG. 1 is a sectional view of a prior art emitter package.
Figure 2:
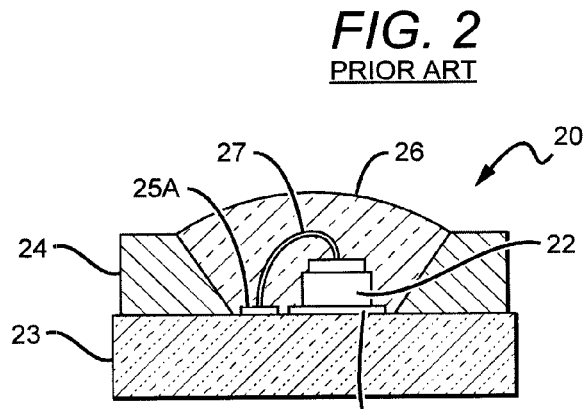
FIG. 2 is a sectional view of a prior art LED component.

The present invention provides structures and methods for producing light emitting devices, such as single or multi-chip LED devices, packages, arrays and lamps that provide high luminous flux output. The electronic elements may include one or more circuit boards with one or more light emitting diodes (LEDs), solar cells, photodiodes, laser diodes, and other such optoelectronic elements or combinations of optoelectronic elements. Several possible embodiments of the present invention are generally directed to light emitting devices incorporating LEDs, but it is understood that other light emitting devices may also be used.

The present invention generally provides devices and methods for manufacturing light emitting devices for increasing light output using a high reflective coating on the board, substrate or submount. The reflective coating can effectively redirect light that is back-emitted from the emitter, back-scattered or reflected by a light diffusion lens, light scattering particles, phosphor particles, and/or microspheres. The present invention may also provide embodiments for optimal color mixing for white light emitting devices.

In the embodiments described herein, the coating on the substrate should be robust and stable over time such that it does not degrade in the presence of emitter light or undergo discoloration and/or degradation at elevated temperatures, after prolonged use or adverse environmental conditions. The reflective coatings according to the present invention are arranged so that the reflective properties of the reflective layer remain substantially constant over time, so that the emitting device retains its emission efficiency over time. In some embodiments, the coatings can comprise a carrier or base material, with dispersed reflective particles in the carrier, with the carrier and reflective particles having different reflective indexes from one another. In some of these embodiments, the reflective particles are dispersed in the carrier with substantially uniform concentration, although in other embodiments the coating can have different areas of different concentrations to provide different reflective properties. The carrier can be substantially transparent to light from the emitter and in some embodiments can be resistant to yellow discoloration; i.e. is substantially non-yellowing. Other embodiments of the coating according to the present invention can comprise a layer of reflective material on the substrate with a protective coating over the reflective material, with the coating being robust and resistant to discoloration over time. The coating can also be arranged to protect the underlying reflective layer from environmental conditions such as moisture and oxidation.

The present invention is particularly applicable to forming reflective coating between circuit layer elements, with examples of circuit layer elements including but not limited to conductive traces, die attach pads, wire bond pads, vias, etc. The present invention is also directed to methods for applying the reflective coating to many different structures, but is particularly applicable to applying a reflective coating to the top of a patterned circuit layer. These methods allow for application of the reflective coating using different processes such as by dispense, spray or spin coating, and the reflective coating can be applied prior to mounting of the one or more LEDs to the board. The reflective coating can be between the elements of the circuit layer elements so that the patterned conductive traces and die attach remain available for LED mounting, contacting and/or wire bonding. This reflective coating can also be further processed such that the coating is at a thickness to compensate for different coefficient of thermal expansion for the coating and surrounding board layers. The manufacturing processes according to the present invention provide for reflective coatings between the circuit elements that are self-aligned with the circuit elements.

The present invention is described herein with reference to certain embodiments but it is understood that the invention can be embodied in many different forms and should not be construed as limited to the embodiments set forth herein. In particular, the present invention is described below in regards to light emitting devices, packages, arrays and lamps having substrates coated by a reflective coating typically comprising a carrier material filled with scattering particles of a different refractive index. Reflective coatings are described in U.S. patent application Ser. No. 13/017,778, to Andrews, and U.S. patent application Ser. No. 12/757,179 to Yuan et al., both of which are incorporated herein by reference.

Many different carrier materials can be used, with suitable carrier material being silicone and glass. More particularly, suitable transparent polymers can be used such as silicones, siloxanes, polyesters, polyurethanes, acrylics (e.g., polyacrylates and polymethacrylates), epoxies, fluoropolymers, polyolefins, and co-polymer and/or combinations thereof. In some embodiments the carrier can comprise polydimethylsiloxanes, polydimethylphenylsiloxanes, polyphenylsiloxanes or blends thereof. Still other embodiments can use polydialkyl-, polydialkylphenyl-, poloydialkylalkylphenyl- and polyalkylphenyl-siloxane polymers can be used. Mixtures, copolymers, and blends of these siloxanes can be used. In some embodiments polydimethylsiloxane and/or polyphenylsiloxanes having sufficient pre-cure viscosities for introduction to the LED devices can be used that cure to a hard gel or durometer layer can be used.

The carrier material can be mixed with a material having high index of refraction, such as high refractive index scattering particles. In some embodiments, the high refractive index material can have an index of refraction greater than about 1.8. In other embodiments it can have an index of refraction greater than about 2, greater than about 2.2, and in some embodiments greater than or equal to about 2.4. Suitable high refractive index scattering particles include inorganic compounds such as titanium dioxide (n=2.4), zinc oxide, zinc sulfate, barium sulfate, boron nitrate, talc, silica, alumina, zeolite, calcium carbonate, magnesium carbonate, barium sulfate, titanium oxide, aluminum hydroxide, magnesium hydroxide, mica, montmorillonite clay, carbon particles, class particles, carbon nanotubes, gas/air bubbles and/or mixtures thereof. The amount of high index of refraction material that can be used will at least depend, in part, on the choice of the carrier material. To provide suitable reflectivity, while not negatively affecting the viscosity, curing and/or dispensability of the carrier, the loading of the high index of refraction material can be between about 3 weight percent to about 60 weight percent. Excess amounts of high index material may result in delaminating of the reflective layer and/or poor dispensing of dispersion of the material on the board. Insufficient amounts of the high index of refraction material may result in insignificant gains in total luminous flux from the LED device. In some embodiments, about 6 to about 15% of the high index of refraction material is used in the transparent matrix.

In some embodiments, the reflective coating can comprise one or more materials with a refractive index of about 2.4 contained in a transparent carrier having a refractive index of less than about 1.5. In one embodiment, the coating can comprise a predetermined amount of titanium dioxide ($TiO_2$) in a silicone carrier. Titanium dioxide can be present in one or more forms such as rutile, anatase, and brookite, and can be provided in particles of different sizes. In some embodiments, the particle size can be between about 1 nanometer (nanoparticles) to about 0.1 to about 10 microns, about 0.5 to about 5 microns, or a size distribution matrix can be used. The reflective coating can have different thicknesses, with some embodiments having a thickness of greater than approximately 100 μm. In other embodiments the reflective coating can have a thickness of greater than 200 μm, while in still other embodiments it can have a thickness of greater than 300 μm. In some embodiments the reflective layer can have a thickness of approximately 150 μm. The reflective coating can be reflective to many different wavelengths or wavelength ranges, such being reflective to the blue, red, yellow, green or white wavelength spectrums.

The methods according to the present invention can also be used for coating other semiconductor devices with different materials. Additionally, single or multiple coatings and/or layers can be formed on the substrate and on the LED chips. A coating can include no phosphors, one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

The present invention is also described herein with reference to reflective coatings that are color stable or substantially resistant to discoloration over time. In some embodiments, the coating can be resistant to yellow discoloration, and can be described as non-yellowing. It is understood that in other embodiments the coatings according to the present invention can be resistant to other colors of discoloration, including but not limited to reddening or blackening.

LEDs can have many different semiconductor layers arranged in different ways and can emit many different colors in different embodiments according to the present invention. LED structures, features, and their fabrication and operation are generally known in the art and only briefly discussed herein. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs), aluminum gallium indium arsenide phosphide (AlGaInAsP), aluminium indium galium phosphide (AlInGaP) or zinc oxide (ZnO).

The growth substrate can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group-III nitrides than sapphire and results in Group-III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent current spreading layer typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques. Because the contacts are accessible from one side of the LEDs (i.e. the top), lateral geometry LEDs can be particularly applicable flip-chip mounting on a substrate or circuit layer.

It will be understood that when an element is referred to as being "on", "connected to", "coupled to" or "in contact with" another element, it can be directly on, connected or coupled to, or in contact with the other element or intervening elements may be present. In contrast, when an element is referred to as being "directly on," "directly connected to", "directly coupled to" or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, region, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in natures and their shapes are not intended to illustrate the precise shape of a region of a device and are not intended to limit the scope of the invention.

Figure 3:
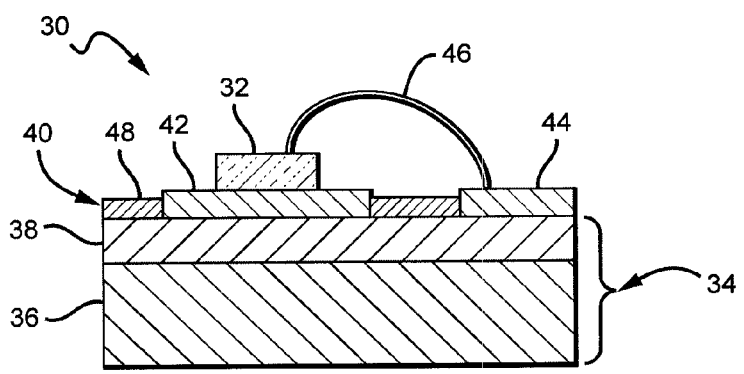
FIG. 3 is a sectional view of one embodiment of a light emitting device according to the present invention.

FIG. 3 shows one embodiment of an LED device 30 according to the present invention comprising an LED 32, mounted to a board, substrate or submount 34 ("submount"). The submount 34 can comprise many different layers and structures, with the submount 34 in the embodiment shown comprising a metal core board 36 and a dielectric layer 38. In the embodiment shown, the metal core board 36 assists in conducting heat away the LED 32 during operation, but it is understood that other boards can be used and other arrangements can similarly conduct heat from the LED, such as through thermally conductive vias. The dielectric layer 38 can provide electrical isolation between the metal core board and the device components on the dielectric layer 38, and can comprise many electrically insulating materials, with suitable materials being polymer based materials (possibly loaded with high thermal conductivity particles). The dielectric layer 38 should also have a thickness that allows for heat to spread from the LED 32 to the metal core board, through the dielectric layer. (applicable to other embodiments without dielectric layer)

A patterned circuit layer 40 is provided on the dielectric layer that can comprise many different features, such as die attach pads and conductive traces. These can be formed from many different known materials and can be formed using many known processes. The LED 32 can be mounted to a die attach pad 42 using known die attach methods, such as solder die attach, with the LED 32 in electrical contact with the die attach pad 42. A wire bond 46 can be included between the LED 32 and conductive trace (or wire bond pad) 44, with the wire bond providing an electrical connection between the two. An electrical signal can be applied to the LED 32 through the die attach pad 42 and the wire bond 46, with this contacting arrangement being particularly applicable to vertical geometry LEDs having contacts on opposing sides.

A reflective coating 48 can be included on the dielectric layer 38 between the elements of the circuit layer 40, with the reflective coating comprising any of the arrangements and materials described above. In the embodiment shown, the coating can cover the entire exposed top surface of the dielectric layer 38, but it is understood that in other embodiments it can cover less than the entire dielectric layer 38. The reflective coating 48 can be many different thicknesses, with the embodiment shown having a reflective coating 48 that is the same as or slightly less than that of the circuit layer 40. In one embodiment, and by way of example, the circuit layer can have a thickness of approximately 100 µm, and the circuit layer can also be 100 µm thick, slightly less than 100 µm, such as in the range of 80 to 100 µm, or 90 to 100 µm. The same circuit layer and reflective coating thickness relationship applies in the same way to circuit layers having a different thicknesses.

In the embodiment shown, the reflective coating 48 does not cover the elements of the circuit layer 40, but in other embodiments it can cover portions of some or all of the circuit layer elements. Different areas and portions of the reflective layer can also have different thicknesses and can comprise different materials.

The LED 32 can also comprise many different features not shown such as a conductive current spreading structure which can made of a conductive material and can be deposited using known methods. Some materials that can be used for these elements include Au, Cu, Ni, In, Al, Ag or combinations thereof and conducting oxides and transparent conducting oxides. The current spreading structure may comprise conductive fingers arranged in a grid with the fingers spaced to enhance current spreading from the pads into the LED's top surface. In operation, an electrical signal may be applied to the pads through a wire bond 46, and the electrical signal spreads through the fingers of the current spreading structure and the top surface into the LED chip 32. Current spreading structures are often used in LEDs where the top surface is p-type, but can also be used for n-type materials.

The LED chip 32 can also be coated with one or more phosphors, with the phosphors absorbing at least some of the LED light and emitting a different wavelength of light such that the LED emits a combination of light from the LED and the phosphor. The LED chip 32 can be coated with a phosphor using many different methods, with one suitable method being described in U.S. patent application Ser. Nos. 11/656, 759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473, 089 entitled "Close Loop Electrophoretic Deposition of Semiconductor Devices", which is also incorporated herein by reference.

As in any arrangement according to embodiments of the present invention, when one or more LED chips are included, any color or color combinations of LEDs may be used to produce a variety of desired effects. Additionally, various anode/cathode pairs may be activated and/or deactivated at any desired time for a variety of varying color effects, combinations, and light intensities. In one embodiment, LED chips 32 can comprise white emitting LEDs with the desired wavelength of light and the desired color temperature, or the LEDs can comprise different LEDs emitting different colors of light that combine to the desired wavelength of light and the desired color temperature. In both arrangements, the light emitting device 10 can emit white light.

Figure 4:
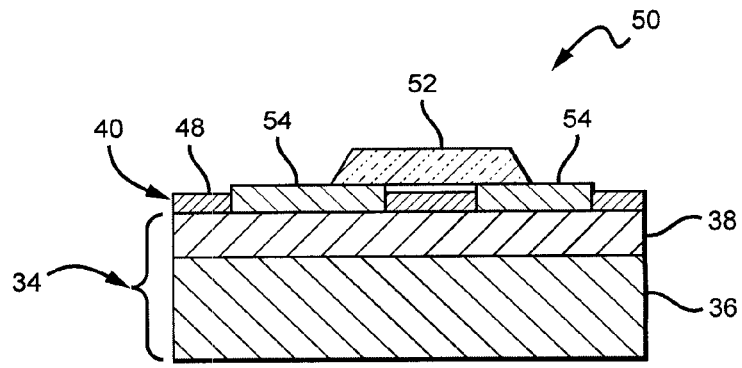
FIG. 4 is a sectional view of one embodiment of a light emitting device according to the present invention.

FIG. 4 shows another embodiment of an LED device 50 according to the present invention having elements that are the same or similar to those in LED device 30. For the same and similar elements the same reference numbers will be used with the understanding that for those numbers the description above, and alternatives, applies equally to this embodiment and those described below. The LED device comprises a submount 34 having a metal core board 36 and a dielectric layer 38, with the circuit layer 40 on the dielectric layer 38. A reflective coating 48 is provided on the dielectric layer 38, between the elements of the circuit layer 40. In this embodiment, an LED 52 is provided that can be directly attached to the circuit layer 40 (i.e. without wire bonds) such as in the case of and LED flip-chip mounted to the elements of the circuit layer 40. This arrangement is particularly applicable to lateral geometry LEDs having contacts accessible from one side. The LED 52 can be mounted to elements of the circuit layer 40, such that the LED 52 can be electrically contacted without the need for a wire bond. That is, the electrical signal from the elements of the circuit layer 40 that causes the LED 52 to emit light, passes to the LED 52 without the use of wire bonds.

In the embodiment shown, the LED 52 is mounted such that it spans the open area between two elements of the circuit layer. As described above, the reflective coating can occupy the area between the circuit elements that is below the LED 52. In this arrangement it can be desirable to have a reflective coating that is thinner than the surrounding elements of the circuit layer. This is particularly true for the area of the coating 48 that is below the LED 52. The coating 48 can be made of a material or materials as described above, that can have different thermal expansion characteristics. In some embodiments, the coating 48 can comprise a carrier with higher thermal expansion characteristics, such that the coating can expand at a greater rate in response to elevated temperatures. This can cause the coating to expand under and push up on the LED 52. This in turn can degrade the electric connection between the LED and the carrier layer, and in some instances can cause the connection to fail. In these embodiments, as well as those described above, some or all of the coating 48 can be up to 20% thinner than the circuit layer 40. In still other embodiments, the coating can be up to 30% thinner than the circuit layer, while other embodiments the coating can be up 50% thinner. In some embodiments, the reflective coating 48 can be at least 50 μm thick to provide the desired reflectivity.

As mentioned above, in some embodiments the coating 48 does not cover the elements of the circuit layer 40. As shown in FIGS. 3 and 4, the elements of the circuit layer 40 can have portions 54 that extend on the dielectric layer 38 such that portions are left uncovered by the particular LED. These extended portions can assist in spreading heat from the LED chip into the dielectric layer 38, and to the metal core board 36. That is, the extended portion can provide heat to a greater surface area of the dielectric layer 38 to allow for a more efficient spread of heat through the dielectric layer 38. These extending portions of the circuit layer elements, however, can also provide an exposed light absorbing area that can absorb portions of the LED light emitted back toward the circuit layer.

Figure 5:
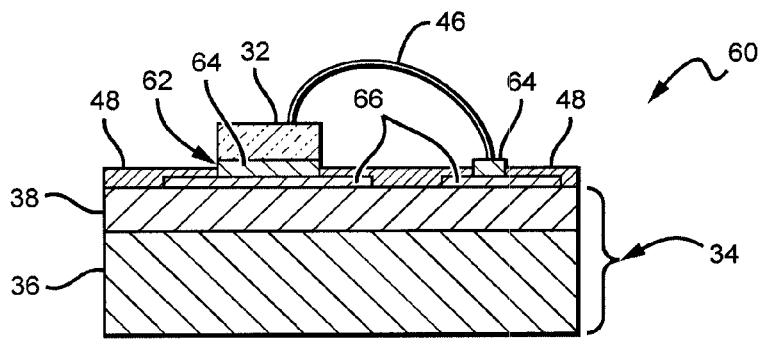
FIG. 5 is a sectional view of one embodiment of a light emitting device according to the present invention.

FIG. 5 shows another embodiment of an LED device 60 according to the present invention that is similar to the LED device 30 shown in FIG. 3, and comprises a submount 34, that can comprise a board 36 and a dielectric layer 38, with the LED device 60 also comprising an LED 32 and wire bond 46. A reflective coating 48 is also included that is arranged similarly to, and can be made of the same materials, as the same coating in the embodiments above. LED device 60 further comprises a circuit layer 62 that can be arranged in different ways to the circuit layers described above to reduce the size of the exposed circuit layer elements. This in turn reduces the area of the light absorbing elements of the circuit layer, while at the same time maximizing the area for the light reflective coating 48.

The circuit layer 62 comprises a top circuit layer 64 on and in thermal and electrical contact with a bottom circuit layer 66. The top circuit layer 64 comprises circuit layer elements that are sized to primarily hold and accommodate electrical connection to the LED 32 and the wire bond 46, with the elements of the top circuit layer 64 having minimal or no thermal management extensions. The elements of the top layer 64 spread heat from the LED 32 to the bottom layer 66, with the bottom layer 66 having element extensions that cover a greater surface area than that of the elements of the top layer 64. These extensions spread heat from the elements of the top layer over the dielectric layer 38 to promote efficient heat transfer to the board 36. Greater surface area of the elements of the bottom layer 66 can result in greater dielectric layer area for spreading heat to the board 36.

The top and bottom layers 64, 66 can have many different thicknesses and can be arranged with many shapes and sizes of extensions. The circuit layer 62 can also have more than two layers or can comprise a single layer that has a gradual transition from top to bottom to provide a greater surface area at the bottom compared to the top. These are only some of the many different ways that the circuit layer 62 can be arranged.

The reflective coating 48 is arranged similarly to the embodiments described above and is between the elements of the top circuit layer 64. The coating 48 is also between the elements of the bottom circuit layer 66, but also cover the portions that extend beyond the elements of the top circuit layer 64. Reducing the size of the elements of the top layer 64 results in the coating 48 covering a greater surface area. This reduces the light absorption by the circuit layer 62, and can increase overall emission efficiency of the LED device 60.

Figure 6:
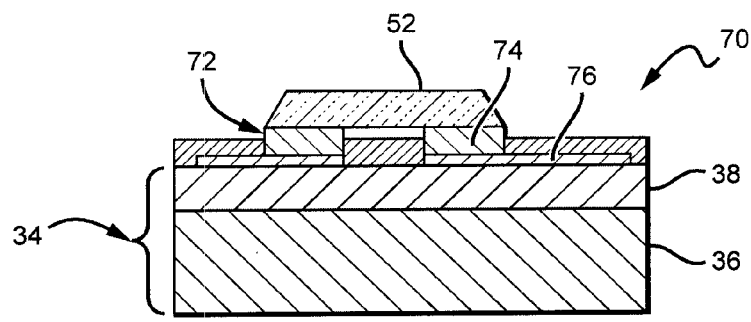
FIG. 6 is a sectional view of another embodiment of a light emitting device according to the present invention.

FIG. 6 shows another embodiment of an LED device 70 according to the present invention that is similar to the LED device 50 shown in FIG. 4, and comprises a submount 34, that can have a board 36 and a dielectric layer 38, with the LED device 70 also comprising an LED 52 similar to the one shown in FIG. 4 and described above. The LED device 70 also comprises a circuit layer 72 similar to circuit layer 62 shown in FIG. 5, with the circuit layer 72 comprising a top circuit layer 74 on and in thermal contact with a bottom circuit layer 76. The top circuit layer 72 is sized to accommodate the LED 52, with minimized element extensions, with the bottom circuit layer having extensions to assist in thermal management. In this embodiment, the LED 52 is flip-chip mounted on the circuit layer 72, as described above with the embodiment in FIG. 4. In this embodiment there are no wire bonds, and the LED 52 is contacted directly to the circuit layer 72. A reflective coating 48 is included between elements of the top circuit layer 74, and over and between elements of the bottom circuit layer 76. The LED spans the area between two of the elements of the top layer 64, and as a result, the coating 48 below the LED 52 can be thinner than the elements of the circuit layer 72 to reduce the reliability impact that can result from the greater thermal expansion of the coating 48.

Figure 7:
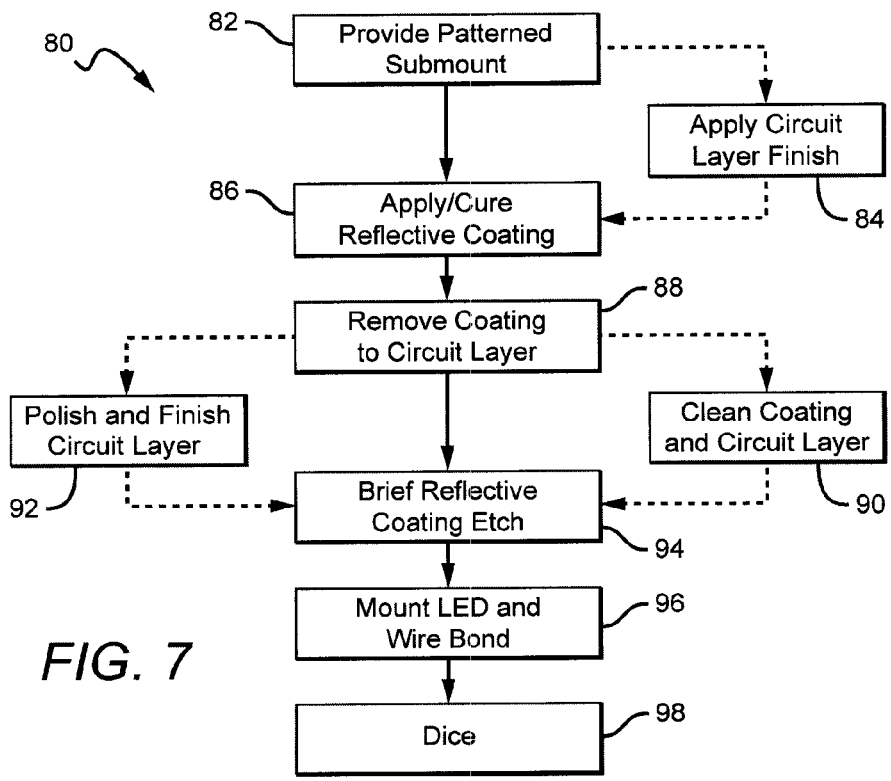
FIG. 7 is a flow diagram for one embodiment of a method for manufacturing LED devices according to the present invention.

The embodiments above can be fabricated using many different methods, with FIG. 7 showing one embodiment of a fabrication method 80 according to the present invention that can be used to fabricate LED devices according to the present invention. Although the method 80 is shown as a series of steps, some of which are optional, it is understood that different embodiments can have different steps and in other embodiments the steps can be performed in different order.

In step 82, a submount is provided having a patterned circuit layer as described above. In some embodiments, the submount can comprise a metal core board and a dielectric layer as described above, with the circuit layer on the dielectric layer. It is understood that many different submounts can be used that are arranged in different ways. As an option step 84, the circuit layer can have a reflective coating applied to it, such as an immersion silver finish applied using known methods. This results in the circuit layer having sidewalls with high reflectivity in the final structure.

In step 86, a reflective coating can be applied to the submount, on the surface with the circuit layer. The coating can be applied using many known methods, with suitable methods being printing, spraying, spin coating, manually brushing on, and/or utilizing a dispensing mechanism. The coating can be applied to cover all or some of the top surface of the circuit layer. The coating is then cured using known curing methods. In step 88, the coating can be removed over the circuit layer using known methods such a grinding or polishing or sandbelting, with this process continuing until the circuit layer is exposed. Portions of the coating remain between the elements of the circuit layer. In step 90, an optional additional polishing can be performed to clean metal residue from the reflective coating surface and to give the circuit layer a desired finish. In step 92, the circuit layer can be given an optional final finish or plating to increase its reflectivity. Different processes can be used, including but not limited to immersion silver or electroless Ni immersion gold (ENIG).

In step 94, the reflective coating can be subjected to a brief etch, such as a chemical etching solution such as Polygone™ commercially available from RPM Technology, LLC. This etch process removes a small portion of the reflective coating so that the circuit layer is thicker than the reflective coating. This results in the circuit layer being higher than the reflective coating, which can increase the reliability of the LED device, particularly in flip-chip arrangements as described above. Step 94 may also serve to remove a top portion of the reflective coating that has degraded in reflectivity during step 92, the final finish or plating, thus restoring the coatings reflectivity. In step 96, one or more LEDs can be mounted to the submount in electrical connection with the circuit layer, and where appropriate, the in step 98 the submount can be diced. It is understood that the submount can be diced before or after mounting of the LED and can be diced before application of the reflective coating.

For the LED devices 60 and 70 shown in FIGS. 5 and 6 above, the same method 80 can also be used, but the submount would be provided with top and bottom circuit layers. These can be fabricated using different methods, and in one embodiment a thick circuit layer can be formed on the submount, and then material can be selectively removed using known methods to form the top and bottom circuit layer arrangement. In other embodiments, the bottom layer can be formed on the submount and then patterned accordingly. The top layer can then be formed on the bottom layer using known methods such as plating, to form the top and bottom layer arrangement. Alternatively, the top layer can be formed separately and then bonded or laminated to the patterned bottom layer. The steps in method 80 can then also be used for LED devices with this two part arrangement.

Figure 8:
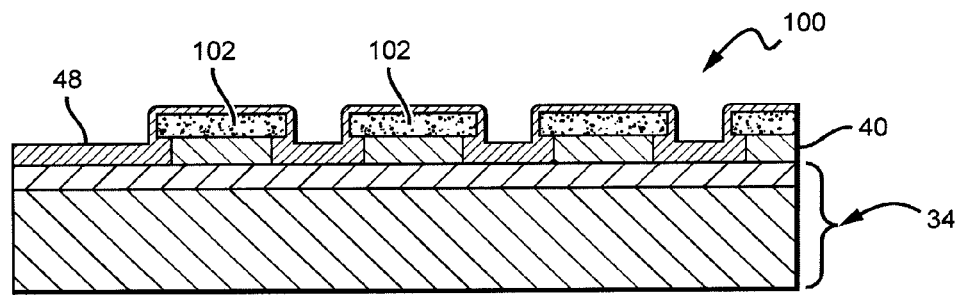
FIG. 8 is a sectional view of an embodiment of an LED device according to the present invention at one of its manufacturing steps.

It is understood that the reflective coating described above can be formed using many different methods beyond those described above. FIG. 8 shows another embodiment of an LED device 100 at one of its manufacturing steps, with the LED device 100 comprising a submount 34, circuit layer 40, and reflective coating 48, as described above. In this embodiment, a mask 102 can be used during formation of the reflective coating 30 to prevent deposition on the circuit layer 40. The mask can comprise a stencil or tape (e.g. commercially available Kapton® tapes) to mask off areas where the reflective coating is not wanted. The reflective layer 30 can then be deposited, and the mask 102 can be removed with the unwanted portions of the reflective coating.

In some embodiments, some of the desired mask areas can be surrounded by areas where reflective coating is desired. This can make the mask not continuous, such that there are portions covered by the mask where reflective coating is desired. To address this problem the isolated mask areas can be connected to the remainder of the mask with narrow mask lines. This reflective coating can flow under these mask lines during deposition to flow to the desired location. Alternatively, two consecutive reflective coating deposition processes can be performed, with most of the desired area coated on the first process, and then the desired areas that were covered by the mask being coated on the second process.

Figure 9:
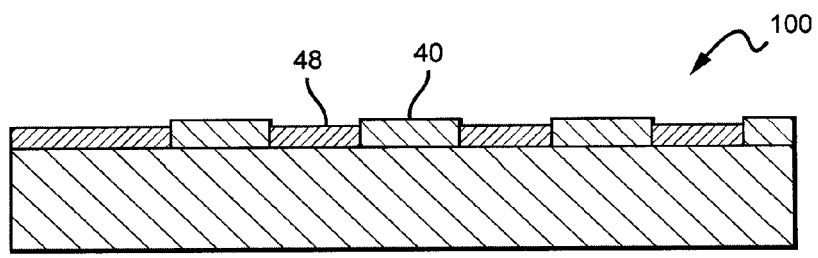
FIG. 9 is a sectional view of the embodiment shown in FIG. 8 at a later manufacturing step.

FIG. 9 shows the LED device 100 with the mask removed, leaving the reflective coating 30 between the elements of the circuit layer 40. The different polishing and finishing steps described in the method 80 are also applicable to this embodiment. For example, a light polish of the circuit layer 40 may be necessary following removal of the mask to clean the surface of the circuit layer 40. Similarly, the post deposition etch of the reflective coating 48 is also applicable in those embodiments where it is desirable to have the reflective coating 48 thinner than the circuit layer 40. The submount can be diced and LEDs can be mounted to the submount in electrical contact with the circuit layer 40.

Figure 10:
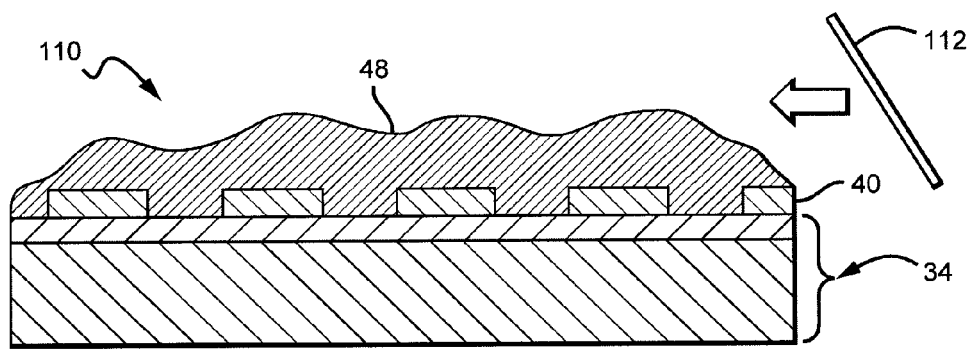
FIG. 10 is a sectional view of an embodiment of an LED device according to the present invention at one of its manufacturing steps.
Figure 11:
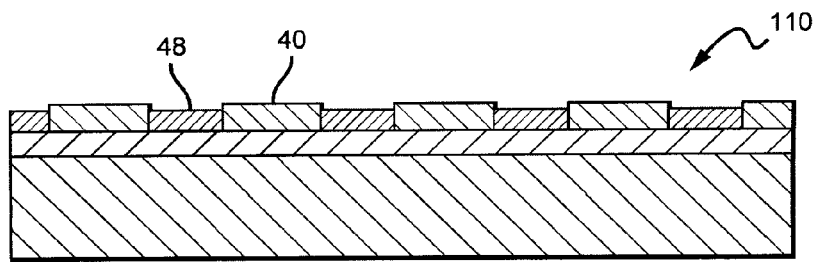
FIG. 11 is a sectional view of the embodiment shown in FIG. 10 at a later manufacturing step.

FIGS. 10 and 11 show another embodiment of an LED device 110 according to the present invention at one of its manufacturing steps. At this point in the manufacturing process, the LED device 110 comprises a submount 34 and a circuit layer 40. The material comprising the reflective coating 48 can be sprayed or dispensed on the LED device 110 and before it is cured excess reflective coating material can be scraped from the LED device 110 using a blade or squeegee 112. The reflective coating material remains between the elements of the circuit layer 40. The material can then be cured to form the reflective coating 48. The different polishing and finishing steps described in the method 80 are also applicable to this embodiment. For example, a light polish of the circuit layer 40 may be necessary following curing of the reflective coating to clean the surface of the circuit layer 40. Similarly, the post deposition etch of the reflective coating 48 is also applicable in those embodiments where it is desirable to have the reflective coating 48 thinner than the circuit layer 40. The submount can be diced and LEDs can be mounted to the submount in electrical contact with the circuit layer 40.

The different methods can be combined in different ways according to the present invention to achieve the best manufacturing method for the particular embodiment. For example, this squeegee method can be combined with the masking method where selective areas can be protected with a mask, and the excess coating can be scraped off with a squeegee. The mask can then be removed along with any remaining reflective coating residue.

Figure 12:
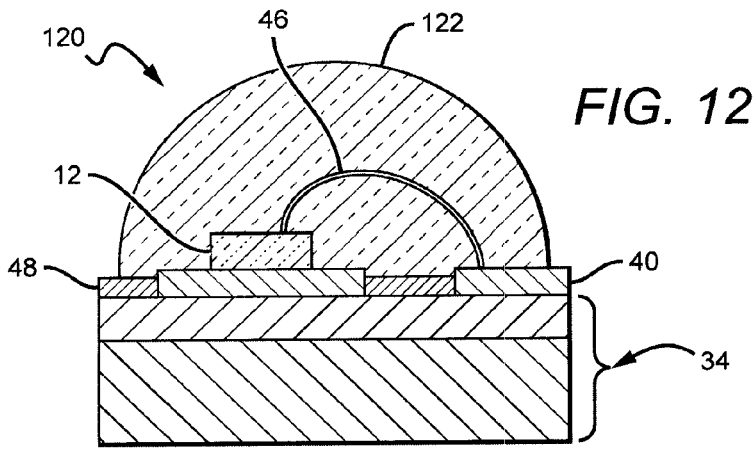
FIG. 12 is a sectional view of another embodiment of a light emitting device according to the present invention with a lens.

The LED devices above are discussed with reference to having an LED, but it is understood that LED devices according to the present invention can comprise more than one LED, and can comprise array of LEDs emitting different colors of light. It is also understood that the LED devices according to the present invention can comprise many different features beyond those described above. FIG. 12 shows another embodiment of an LED device 120 according to the present invention that is similar to those described above, and comprises an LED 32, submount 34, circuit layer 40, wire bond 46 and reflective coating 48. LED device 120 further comprises a lens 122 over the LED device to shape or focus light from the LED and/or to provide protection for the LED and its surrounding components. The lens 122 can be made of many known materials that are compatible with formation over an LED and with the transmission of LED light.

The lens 122 can be arranged over the LED 32 after the submount fabrication, including reflective layer attachment, LED die attach and wire bonding. The lens 122 can be molded over the LED 32 or can be separately fabricated and bonded over the LED 32. The lenses in different embodiments can be confined to areas with an exposed circuit layer, or they can extend onto submount areas covered with the reflective coating 48. Different lenses according to the present invention can also include conversion materials, such as phosphors, in or on the lens and the lens can include light scattering materials. In still other embodiments the lens can include features to enhance light extraction, such as texturing, and the lens can be compatible with secondary optics and/or remote phosphors.

Figure 13:
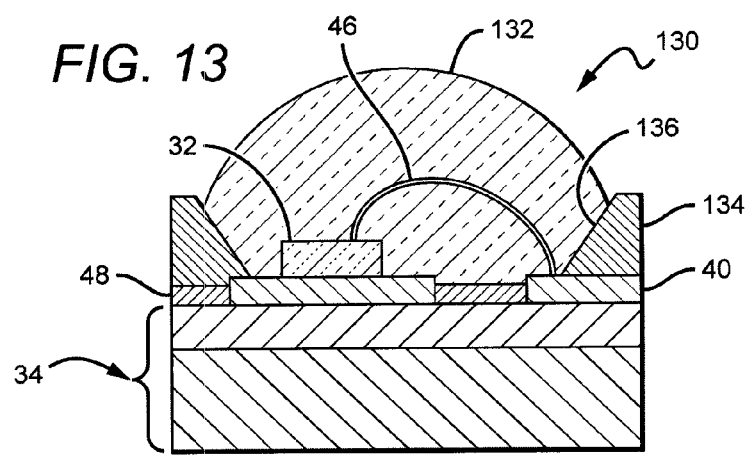
FIG. 13 is a sectional view of another embodiment of a light emitting device according to the present invention reflective feature.

FIG. 13 shows still another embodiment of an LED device 130 that is also similar to the LED devices described above and also comprises an LED 32, submount 34, circuit layer 40, wire bond 46 and reflective coating 48. This embodiment also comprises a lens 132 similar to the lens 122 described above and shown in FIG. 12, with lens 132 being made of the same material and being arranged with the different features described. LED device 130 further comprises a reflective feature 134 arranged on the submount 34 and having a reflective surface to reflect LED light in the desired direction. The reflective feature 134 can have many different shapes and sizes and be mounted in many different locations on the submount 34. In the embodiment shown, the reflective feature 134 comprises a reflective cup mounted on the submount around the LED 32. The reflective cup has a reflective surface 136 to reflect sideways emitted light in an upward direction. This is only one of the many different reflective features that can be used with LED devices according to the present invention.

Figure 14:
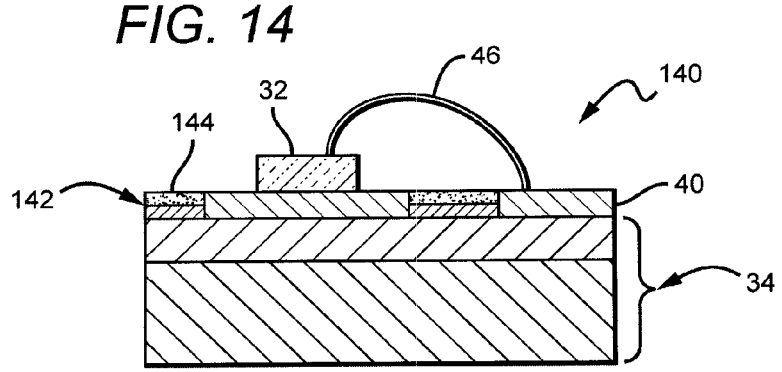
FIG. 14 is a sectional view of another embodiment of a light emitting device according to the present invention with a conversion material.

FIG. 14 shows another embodiment of an LED device 140 according to the present invention that comprises an LED 32, submount 34, circuit layer 40 and wire bond 46. The LED device also comprises a reflective coating 142, but in this embodiment the reflective coating is arranged in conjunction with a conversion material 144. In the embodiment shown, the conversion material 144 is shown as being on the reflective coating 142, either as a separate layer or as being mixed in with the reflective coating material. Many different conversion materials can be used, with a suitable material being one or more phosphors.

LED light that is directed back toward the reflective coating also passes through the conversion material where at least some of the light is absorbed and re-emitted at a different wavelength. This re-emitted light emits omnidirectionally from the conversion material with at least a portion emitting out as useful LED device emission. Additional re-emitted light can be reflected by the reflective coating along with the LED light. The conversion material can be arranged in many different locations in the reflective coating, and can be arranged in different regions or areas of the coating.

Figure 15:
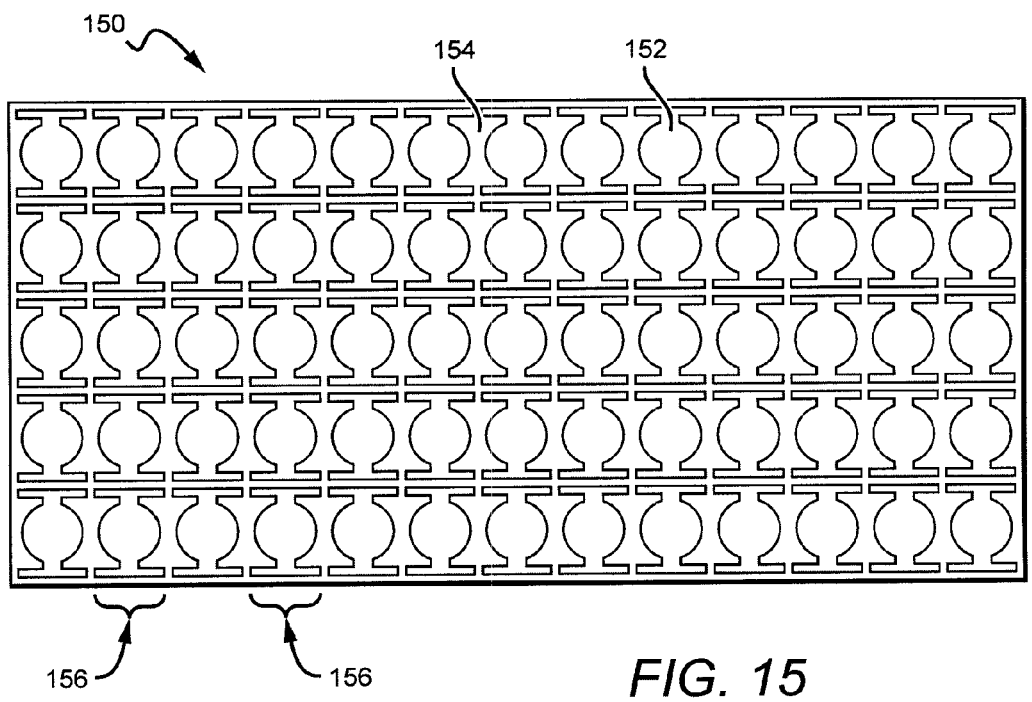
FIG. 15 is a top plan view of one embodiment of a wafer or substrate according to the present invention.

The LED devices according to the present invention can be fabricated as single devices, or can be fabricated as a plurality of devices on a wafer or substrate with the individual devices being diced from the wafer or substrate. FIG. 15 shows one embodiment of a substrate 150 according to the present invention showing the exposed circuit layer 152 and the reflective coating 154. The substrate 150 comprises a plurality of circuit layer and reflective coating portions 156 arranged for a single LED device.

The substrate 150 can be fabricated using many different processes, and in one embodiment can comprise a ceramic submount that has a Cu circuit layer. The reflective coating can be spray coated on the entire submount and a grinding can be applied to the substrate to expose the circuit layer. The substrate can then be cleaned to remove metal residues from the reflective coating and to remove reflective coating materials from the circuit layer. The LED can then be mounted to the substrate using known die attach processes, and the substrate can be wire bonded. The substrate can then be diced separate the individual LED devices from the substrate. In alternative embodiments the substrate can be diced prior to die attach and wire bonding, with the LEDs mounted after dicing.

The lighting devices above are shown and described with one LED arranged in different ways, but it is understood that many other embodiments can be arranged with more than one LED. Some of these embodiments can comprise an array of LED arranged in different patterns and some embodiments can comprises different types of LEDs. The LEDs can be made from different material systems, with some being made from a Group-III nitride material such as GaN. Some LEDs can be electrically connected to the circuit layer using wire bonds, while others can be direct attached to the circuit layer, such as by flip chip mounting of lateral geometry LEDs as described above. The different LEDs can be made of different material systems with some or all being made of a Group-III nitride material, such as GaN. In some embodiments the emission of each LED in the array can be individually controlled to vary the emission of the LED device, while in other embodiments the LEDs in the LED device emit in response to a single electrical signal.

Figure 16:
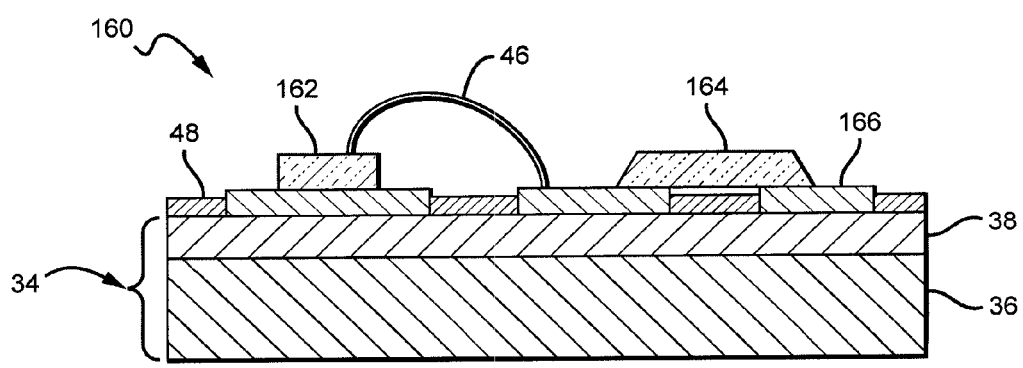
FIG. 16 is a sectional view of another embodiment of a light emitting device according to the present invention having two LEDs.

FIG. 16 shows one embodiment of a multiple LED emitting device 160 according to the present invention, having first and second LEDs. The lighting device 160 is shown with first and second LEDs 162, 164, but it is understood that other lighting devices can have more than two LEDs. The lighting device 160 further comprises a submount 34 having a metal core board 36 and a dielectric layer 38, with a circuit layer 166 on the dielectric layer 38. A reflective coating 48 can be provided on the dielectric layer 38, between the elements of the circuit layer 166. In this embodiment, the first LED 162 is mounted to the circuit layer in way similar to LED 30 shown in FIG. 3 and described above. The wire bond 46 can be included between the LED 162 and the circuit layer 166, with the wire bond providing an electrical connection between the two. An electrical signal can be applied to the LED 162 through the circuit layer 166 and the wire bond 46, with this contacting arrangement being particularly applicable to vertical geometry LEDs having contacts on opposing sides.

The second LED 164 can be mounted to the circuit layer 166 in a way similar to the LED 50 shown in FIG. 4 and described above. The second LED 164 can be flip-chip mounted to the elements of the circuit layer 166. The second LED 164 can have lateral geometry with contact accessible from one side, and can be mounted to the circuit layer 166, such that the second LED 164 can be electrically contacted without the need for a wire bond. As described above, for LED 164 the reflective coating can occupy the area between the circuit elements that is below the LED 164. In this arrangement it can be desirable to have a reflective coating that is thinner than the surrounding elements of the circuit layer, particularly true for the area below the second LED 164. For the first and second LEDs 162, 164, the reflective coating 48 and LEDs do not cover the elements of the circuit layer 166. Like the embodiments above, these extended portions can assist in spreading heat from the LED chip into the dielectric layer 38, and to the metal core board 36.

Figure 17:
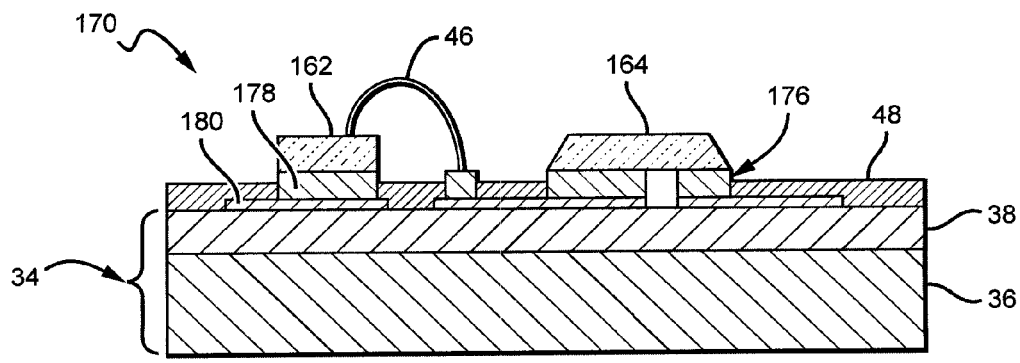
FIG. 17 is a sectional view of another embodiment of a light emitting device according to the present invention also having two LEDs.

FIG. 17 shows still another embodiment of LED device 170 according to the present invention, also comprising first and second LEDs 162, 164 that are similar to those shown in FIG. 16. The lighting device 170 further comprises a submount 34 having a metal core board 36, a dielectric layer 38 and a circuit layer 176. A reflective coating 48 can be provided on the dielectric layer 38, between the elements of the circuit layer 176. The LED device 170 can comprise many different types of LEDs mounted and electrically connected in many different ways. In this embodiment, the first LED 162 is mounted to the circuit layer 176 in way similar to LED 30 shown in FIG. 3 and described above. The wire bond 46 can be included between the LED 162 and the circuit layer 176, with the wire bond providing an electrical connection between the two. The second LED 164 can be mounted to the circuit layer 176 in a way similar to the LED 50 shown in FIG. 4 and described above. The second LED 164 can be flip-chip mounted to the elements of the circuit layer 176.

In this embodiment, the circuit layer 176 can comprise a top layer 178 on and in thermal and electrical contact with a bottom circuit layer 180, in a way similar to circuit layers 62, 72 shown in FIGS. 4 and 5 and described above. The top circuit layer 178 comprises circuit layer elements that are sized to primarily hold and accommodate electrical connection to the first LED 162 and the wire bond 46, and for flip chip mounting of the second LED 164. The elements of the top circuit layer 178 having minimal or no thermal management extensions, and the elements of the top layer 178 spread heat from the LEDs 162, 164 to the bottom layer 180, with the bottom layer 180 having element extensions that cover a greater surface area than that of the elements of the top layer 178 to spread heat to the dielectric layer 38 to promote efficient heat transfer to the board 36.

It is understood that different embodiments of LED devices according to the present invention can have different numbers and combinations of LEDs, with some having wire bonds and others not having wire bonds. These embodiments can also have circuit layers arranged in different ways, with portions having the two layer arrangement as shown in FIG. 17, and others having the single layer arrangement as shown in FIG. 16. Other embodiments can also have a reflective coating with many different features, such as conversion material. The LED devices can also be arranged with many different features such as primary and secondary optics, reflective cups, power circuitry, etc.

Figure 18:
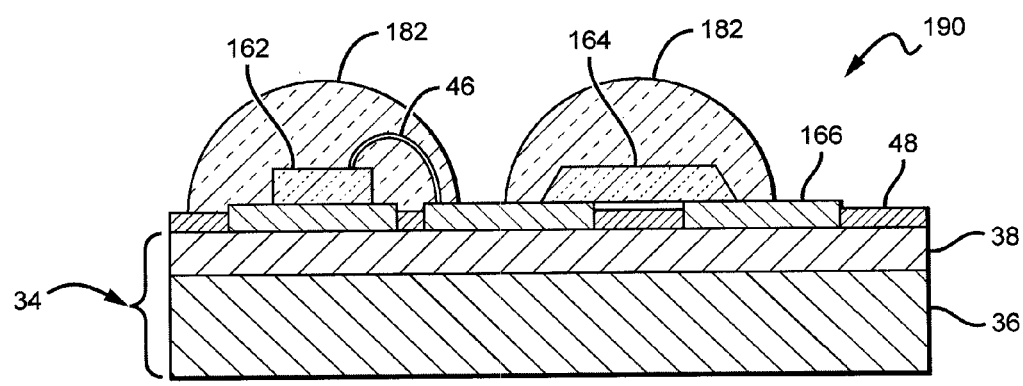
FIG. 18 is sectional view of still another embodiment of a light emitting device according to the present invention with two LEDs, each having a lens.

FIG. 18 shows still another embodiment of a multiple LED emitting device 190 according to the present invention, having first and second LEDs 162, 164, a submount 34 having a metal core board 36 and a dielectric layer 38, with a circuit layer 166 on the dielectric layer 38. A reflective coating 48 is provided on the dielectric layer 38, between the elements of the circuit layer 166. In this embodiment, the first LED 162 is mounted to the circuit layer 166 with a wire bond 46. The second LED 164 can be mounted to the circuit layer 166 without a wire bond (e.g. flip-chip). Like the embodiments above, the extended portions of the circuit layer 166 can assist in spreading heat from the LED chip into the dielectric layer 38, and to the metal core board 36. In this embodiment, optical elements 182 are included over the LEDs 162, 164, and can comprise a material that is transmissive to the light emitted by the LEDs, and can shape the emission pattern from its respective LED. The lenses 182 can also comprise a material (on or integral to) that disperse and/or to converts the LED light. In the embodiment shown, the lenses are directly on the LEDs 162, 164 and comprise a primary optic. The lenses can be formed on the LEDs using molding processes or can be formed separately and placed over the LEDs 162, 164. In other embodiments, secondary optics can also be included to further shape, disperse of convert the light emission from the LEDs 162, 164.

Figure 19:
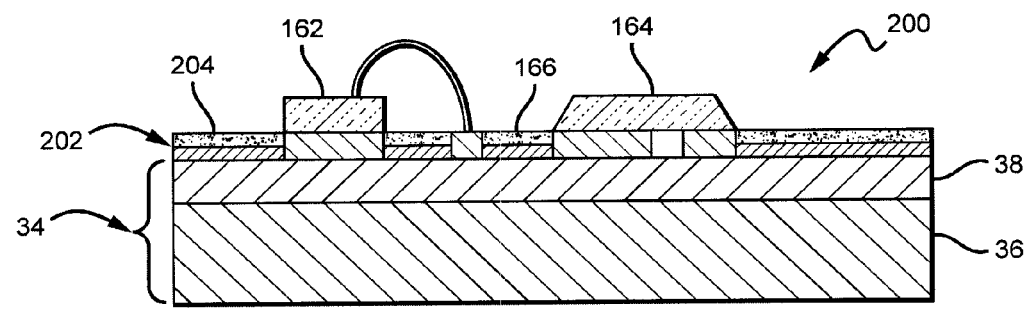
FIG. 19 is a sectional view of still another embodiment of a light emitting device according to the present invention with two LEDs.

FIG. 19 shows still another embodiment of a multiple LED emitting device 200 according to the present invention, having first and second LEDs 162, 164, a submount 34 having a metal core board 36 and a dielectric layer 38, with a circuit layer 166 on the dielectric layer 38. A reflective coating 202 is provided on the dielectric layer 38, between the elements of the circuit layer 166. The reflective coating 202 can be arranged in similar to the reflective coating 202 shown in FIG. 14 and described above, with the reflective coating arranged in conjunction with a conversion material 204. In the embodiment shown, the conversion material 204 is shown as being on the reflective coating 202, either as a separate layer or as being mixed in with the reflective coating material. Many different conversion materials can be used, with a suitable material being one or more phosphors.

While several illustrative embodiments of the invention have been shown and described, numerous variations and alternate embodiments will occur to those skilled in the art. Each of the features described above can be used with the different embodiments described above. For example, the lens, reflective cup and phosphor layer can be used with the flip-embodiments in much the same way as the wire bonded embodiments. Such variations and alternate embodiments are contemplated, and can be made without departing from the spirit and scope of the invention as defined in the appended claims.

We claim:

1. A light emitting device, comprising:
a submount comprising a circuit layer, said circuit layer comprising a plurality of elements;
a reflective coating between at least some of the plurality of elements of said circuit layer; and
a light emitting diode (LED) mounted to said circuit layer, said reflective coating being reflective to the light emitted by said light emitting diode, wherein said reflective coating physically contacts at least a portion of one of said plurality of elements.

2. The device of claim 1, wherein said reflective coating comprises a carrier material with scattering particles having a different index of refraction than said carrier material.

3. The device of claim 2, wherein said carrier material comprises silicone or glass.

4. The device of claim 1, wherein said submount comprises a dielectric layer, said circuit layer and reflective coating on said dielectric layer.

5. The device of claim 1, wherein said submount comprises a metal core board.

6. The device of claim 1, wherein said plurality of elements comprises conductive traces, die attach pads and wire bond pads.

7. The device of claim 1, wherein said LED is wire bonded to said circuit layer.

8. The device of claim 1, wherein said LED is flip-chip mounted to said circuit layer.

9. The device of claim 1, wherein said circuit layer comprises a top layer and a bottom layer that are in thermal contact and electrical contact, wherein said top and bottom layers cover different surface areas on said submount.

10. The device of claim 9, wherein said bottom layer covers more surface area than said top layer.

11. The device of claim 9, wherein the top layer of said circuit layer covers less surface area than the bottom layer of said circuit layer.

12. The device of claim 1, wherein said circuit layer comprises extension portions not covered by said LED.

13. The device of claim 1, wherein at least one portion of said reflective coating is thinner than the circuit layer.

14. The device of claim 1, wherein at least a portion of a top surface of said reflective coating is below a top surface of said circuit layer.

15. The device of claim 1, wherein said reflective coating being substantially non-discoloring and non-degrading over time, prolonged use, or exposure to blue light.

16. The device of claim 1, further comprising a lens.

17. The device of claim 1, further comprising a reflective cup.

18. A light emitting device, comprising:
a submount comprising a circuit layer, said circuit layer comprising a plurality of elements;
a reflective coating between at least some of the plurality of elements of said circuit layer; and
a light emitting diode (LED) mounted to said circuit layer, said reflective coating being reflective to the light emitted by said light emitting diode, wherein said reflective coating further comprises a conversion material.

19. A light emitting device, comprising:
a submount comprising a circuit layer, said circuit layer comprising a plurality of elements;
a reflective coating between at least some of the plurality of elements of said circuit layer; and
a light emitting diode (LED) flip-chip mounted to said circuit layer, said LED spanning a space between at least two of said plurality of elements, a top surface of said reflective coating below said LED being lower than a surface of said circuit layer, wherein said reflective coating physically contacts at least a portion of one of said plurality of elements.

20. The light emitting device of claim 19, wherein the thickness of said reflective coating below said LED is less than the thickness of said circuit layer below said LED.

21. A light emitting device, comprising:
a submount comprising a circuit layer, said circuit layer comprising a plurality of elements, a top surface of said circuit layer having a smaller surface area than a bottom surface of said circuit layer;
a reflective coating between at least some of the plurality of elements of said circuit layer, wherein said reflective coating physically contacts at least a portion of one of said plurality of elements; and
a light emitting diode (LED) mounted to said circuit layer.

22. The device of claim 21, wherein said reflective coating is reflective to the light emitted by said LED.

23. The device of claim 21, wherein said circuit layer comprises a top circuit layer and a bottom circuit layer, wherein the top circuit layer covers less surface area than said bottom circuit layer.

24. The device of claim 21, wherein said reflective coating comprises a carrier material with scattering particles having a different index of refraction than said carrier material.

25. A multiple element light emitting device, comprising:
a submount comprising a circuit layer, said circuit layer comprising a plurality of elements;
a reflective coating between at least some of the plurality of elements of said circuit layer; and
a plurality of light emitting diodes (LEDs) mounted to said circuit layer, wherein at least some of said plurality of LEDs have different geometries, said reflective coating being reflective to the light emitted by at least some of said plurality of LEDs, wherein said reflective coating physically contacts at least a portion of one of said plurality of elements.

26. The device of claim 25, wherein at least one of said plurality of LEDs has a lateral geometry.

27. The device of claim 25, wherein at least one of said plurality of LEDs is directly attached to said circuit layer.

28. The device of claim 25, wherein at least one of said plurality of LEDs has a vertical geometry.

29. The device of claim 25, wherein at least one of said plurality of LED is attached to said circuit layer with a wire bond.

30. The device of claim 25, further comprising a lens over at least one of said plurality of LEDs.

31. The device of claim 25, wherein said circuit layer comprises a top circuit layer and a bottom circuit layer, wherein the top circuit layer covers less surface area than said bottom circuit layer.

32. The device of claim 25, wherein said reflective coating comprises a carrier material with scattering particles having a different index of refraction than said carrier material.

33. The device of claim 25, wherein said circuit layer comprises extension portions not covered by said plurality of LEDs.

34. A multiple element light emitting device, comprising:
a submount comprising a circuit layer, said circuit layer comprising a plurality of elements;
a plurality of light emitting diodes (LEDs) electrically connected to said circuit layer, wherein at least one of said light emitting diodes plurality of LEDs are electrically connected by a wire bond to said circuit layer, and at least one of said plurality of LEDs are directly attached to said circuit layer; and
a reflective coating between at least some of said plurality of elements of said circuit layer, wherein said reflective coating physically contacts at least a portion of said plurality of elements.

35. The device of claim 34, wherein said reflective coating is reflective to the light emitted by said plurality of LEDs.

36. The device of claim 34, wherein at least some of said plurality of LEDs have different geometries.

37. The device of claim 34, further comprising a lens over at least one of said plurality of LEDs.

38. The device of claim 34, wherein said circuit layer comprises a top circuit layer and a bottom circuit layer, wherein the top circuit layer covers less surface area than said bottom circuit layer.

39. The device of claim 34, wherein said reflective coating comprises a carrier material with scattering particles having a different index of refraction than said carrier material.

40. The device of claim 34, wherein said circuit layer comprises extension portions not covered by said plurality of LEDs.

41. The device of claim 34, wherein at least some of said plurality of LEDs comprise a Group-III nitride material.

42. The device of claim 34, wherein at least some of said plurality of LEDs comprise gallium nitride (GaN).

* * * * *